United States Patent
Luoh et al.

(10) Patent No.: US 7,335,610 B2
(45) Date of Patent: Feb. 26, 2008

(54) ULTRAVIOLET BLOCKING LAYER

(75) Inventors: Tuung Luoh, Taipei (TW); Ling Wuu Yang, Hsinchu (TW); Kuang Chao Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 359 days.

(21) Appl. No.: 11/116,719

(22) Filed: Apr. 28, 2005

(65) Prior Publication Data

US 2006/0019500 A1 Jan. 26, 2006

Related U.S. Application Data

(60) Provisional application No. 60/590,686, filed on Jul. 23, 2004.

(51) Int. Cl.
*H01L 21/00* (2006.01)
(52) U.S. Cl. .......... 438/795; 257/E21.27; 257/659; 438/785; 438/783
(58) Field of Classification Search .......... 438/785, 438/795, 783, 127; 257/E21.27, 659
See application file for complete search history.

(56) References Cited

U.S. PATENT DOCUMENTS

| | | | |
|---|---|---|---|
| 5,858,870 A | 1/1999 | Zheng et al. | |
| 5,869,394 A | 2/1999 | Chen et al. | |
| 6,017,780 A | 1/2000 | Roy | |
| 6,087,278 A | 7/2000 | Kim et al. | |
| 6,274,514 B1 | 8/2001 | Jang et al. | |
| 6,458,722 B1 | 10/2002 | Kapoor et al. | |
| 6,475,895 B1 | 11/2002 | Mei et al. | |
| 6,521,922 B1 | 2/2003 | Huang et al. | |
| 6,790,772 B2 | 9/2004 | Chung et al. | |
| 6,916,736 B2 | 7/2005 | Hsu et al. | |
| 7,060,554 B2 | 6/2006 | Ngo et al. | |
| 7,087,482 B2* | 8/2006 | Yeo et al. | 438/240 |
| 7,169,696 B2* | 1/2007 | Heath et al. | 438/618 |
| 7,208,426 B2 | 4/2007 | Huang et al. | |
| 2002/0045282 A1* | 4/2002 | Opsal et al. | 438/16 |
| 2003/0096476 A1* | 5/2003 | Bloom et al. | 438/257 |
| 2003/0168001 A1 | 9/2003 | Sneh | |
| 2004/0005781 A1 | 1/2004 | Huang et al. | |
| 2004/0151025 A1* | 8/2004 | Ngo et al. | 365/185.01 |
| 2004/0240375 A1* | 12/2004 | Shinoda | 369/288 |
| 2006/0079057 A1* | 4/2006 | Cho et al. | 438/286 |

(Continued)

OTHER PUBLICATIONS

Ashburn, S. P. et al., Degradation of Deep Sub-micron Isolation by Vacuum Ultraviolet Radiation from Low Temperature Back End Plasma-Assisted Processes, IEEE, IEDM, 1997, pp. 449-452.

(Continued)

*Primary Examiner*—Caridad Everhart
(74) *Attorney, Agent, or Firm*—Mark Haynes; Haynes Beffel & Wolfeld LLP

(57) ABSTRACT

Semiconductor structures and methods of fabricating semiconductor structures are disclosed. The method comprises the steps of: providing an initial semiconductor structure; forming a non-silicon layer overlying the initial semiconductor structure, the non-silicon layer having an extinction coefficient greater than zero at wavelengths below about 300 nanometers; and performing a plasma-based process to form a layer overlying the non-silicon layer, the non-silicon layer preventing the ultraviolet radiation generated during the plasma-based process from damaging the initial semiconductor structure.

36 Claims, 2 Drawing Sheets

U.S. PATENT DOCUMENTS

2006/0145303 A1* 7/2006 Wu et al. .................... 257/632
2007/0001160 A1* 1/2007 Cheong et al. ................. 257/4

OTHER PUBLICATIONS

Dori, Leonello, et al., "Optimized Silicon-Rich Oxide (SRO) Deposition Process for 5-V-Only Flash EEPROM Applications," IEEE Electron Device Letters 14(6) (Jun. 1993) pp. 283-285.

Shuto, Susumu, et al., "UV-blocking technology to reduce plasma-induced transistor damage in ferroelectric devices with low hydrogen resistance," IEEE, 37th Annual International Reliability Physics Symp, 1999m 356-361.

Singer, Peter, ed. "Anti-Reflective Coatings: A Story of Interfaces," Semiconductor International, Mar. 1, 1999, 5 pp.

Song, Seung-Chul et al., Avoiding Plasma Induced Damage to Gate Oxide with Conductive Top Film (CTF) on PECVD Contact Etch Stop Layer, 2002 Symposium on VLSI Technology Digest of Technical Papers, pp. 72-73.

Thomas, N. et al., UV-Shifted Durable Silver Coating for Astronomical Mirrors, Submitted to Astronomical Telescopes and Instrumentation, Munich, Germany, Mar. 27-31, 2000, 14 pp.

\* cited by examiner

Comparison of extinction coefficient for $Ta_2O_5$, $HfO_x$ and $HfTaO_x$ vs. wavelength

ULTRAVIOLET BLOCKING LAYER

RELATED APPLICATIONS

This application claims the benefit of U.S. Provisional Application No. 60/590,686 filed 23 Jul. 2004.

BACKGROUND OF THE INVENTION

1. Field of the Invention

The present invention relates to semiconductor structures and to a method of fabricating semiconductor structures. More particularly, embodiments relate to semiconductors having an ultraviolet (UV) blocking layer and to processes for fabricating such semiconductors.

2. Description of the Related Art

As semiconductor device density increases, device geometry has continued to shrink and the dimensional requirements of such devices has become more exacting. Plasma process technology is used in ultra large scale integrated circuit (ULSI) fabrication to meet these demands and provides for improved directionality of etch and deposition and for tighter thermal budget control.

Examples of plasma process technologies include plasma implantation, plasma sputtering, physical vapor deposition (PVD), dry etching and chemical vapor deposition (CVD) such as, for example, plasma assisted chemical vapor deposition (PA CVD), plasma-enhancement chemical vapor deposition (PE CVD) and high-density plasma chemical vapor deposition (HD CVD).

However, the use of plasma processing increases the potential for severe damage of semiconductor devices which may result in deteriorated performance of those semiconductor devices. Also, any ultraviolet electromagnetic radiation (UV) produced during plasma processing may alter the semiconductor device behavior and, in particular, may degrade gate oxide reliability of floating gate transistors.

Page 72 of IEEE Symposium on VLSI Technology Digest of Technical Papers 2002, "Avoiding Plasma Induced Damage to Gate Oxide With a Conductive Top Film (CTF) on PECVD Contact Etch Stop Layer", by Seung-Chul Song et al. describes the use of a thin undoped silicon layer on a contact etch stop layer in order to reduce plasma-induced damage.

Page 356 of IEEE 99CH36296 37th Annual International Reliability Physics Symposium, San Diego, Calif., 1999, by Shuto et al describes that silicon nitride and silicon oxynitride can be used to reduce plasma-induced damage.

Page 449 of IEEE IEDM97, "Degradation of Deep Sub-Micron Isolation by Vacuum Ultraviolet Radiation from Low Temperature Back End Plasma-Assisted Processes", by Ashburn et al. describes that plasma processing can also damage isolation oxides. Such isolation oxide damage can be reduced in areas covered by polysilicon.

However, there exists a need to provide an effective ultraviolet blocking layer for fabricating semiconductor devices.

SUMMARY OF THE INVENTION

According to a first aspect of the present invention there is provided a method of fabricating a semiconductor structure, the method comprising the steps of: providing an initial semiconductor structure; forming a non-silicon layer overlying the initial semiconductor structure, the non-silicon layer having an extinction coefficient greater than zero at wavelengths below about 300 nanometers; and performing a plasma-based process to form a layer overlying the non-silicon layer, the non-silicon layer preventing the ultraviolet radiation generated during the plasma-based process from damaging the initial semiconductor structure.

In embodiments, the non-silicon layer has an extinction coefficient greater than zero at wavelengths between about 200 and 300 nanometers.

In embodiments, the non-silicon layer has an extinction coefficient of at least 0.03 at wavelengths below about 300 nanometers.

In embodiments, the non-silicon layer has an extinction coefficient of at least 0.08 at wavelengths below about 300 nanometers.

In embodiments, the non-silicon layer has a dielectric constant greater than about 20.

In embodiments, the non-silicon layer comprises at least one of $Ta_2O_5$, $HfO_2$ and $HfTaO_2$.

In embodiments, the non-silicon layer is formed by atomic layer deposition.

In embodiments, the non-silicon layer is formed at a temperature of less than about 200 Celsius.

In embodiments, the semiconductor structure is formed within an interlayer dielectric.

In embodiments, the step of providing the initial semiconductor substrate comprises the steps of: forming a tunnel oxide layer overlying a semiconductor substrate; and forming a gate structure overlying the tunnel oxide layer.

In embodiments, the step of providing the initial semiconductor substrate further comprises the step of: forming at least an insulating layer overlying the tunnel oxide layer and the gate structure.

In embodiments, the method further comprises the step of forming an insulating layer overlying the non-silicon layer.

In embodiments, the step of providing the initial semiconductor substrate further comprises the step of: forming a charge storage layer overlying the tunnel oxide layer beneath the gate structure.

In embodiments, the step of providing the initial semiconductor substrate further comprises the steps of: forming a nitride layer overlying the tunnel oxide layer; and forming a top oxide layer overlying the nitride layer, wherein the nitride layer and the top oxide layer are beneath the gate structure.

In embodiments, the gate structure comprises at least one of polysilicon, polysilicon/silicide composite and tungsten.

In embodiments, the step of providing the initial semiconductor substrate comprises the steps of: providing a surface on a semiconductor substrate; forming a doped region in the semiconductor substrate and below the surface; and forming an isolation structure in at least part of the doped region.

In embodiments, the isolation structure comprises shallow trench isolation trench (STI) and localized oxidation isolation (LOCOS).

In embodiments, the doped region comprises one of an n-type region and a p-type region.

In embodiments, the step of providing the initial semiconductor substrate comprises the steps of: providing a semiconductor substrate having a plurality of metal lines thereon.

In embodiments, the plurality of metal lines comprise at least one of aluminum, aluminum alloy and copper.

According to a second aspect of the present invention there is provided a semiconductor structure comprising: an initial semiconductor structure; a non-silicon layer overlying the initial semiconductor structure, the non-silicon layer having an extinction coefficient greater than zero at wavelengths below about 300 nanometers; and a plasma process formed layer overlying the non-silicon layer.

According to a third aspect of the present invention there is provided a method of fabricating a semiconductor structure, the method comprising the steps of: providing an initial semiconductor structure; forming a non-silicon layer comprising at least one of Ta2O5, HfO2 and HfTaO2 overlying the initial semiconductor structure; and performing a plasma-based process to form a layer overlying the non-silicon layer, the non-silicon layer preventing the ultraviolet radiation generated during the plasma-based process from damaging the initial semiconductor structure.

According to a fourth aspect of the present invention there is provided a semiconductor structure comprising: a semiconductor structure; and a layer overlying the semiconductor structure, the non-silicon layer comprising at least one of Ta2O5, HfO2 and HfTaO2.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
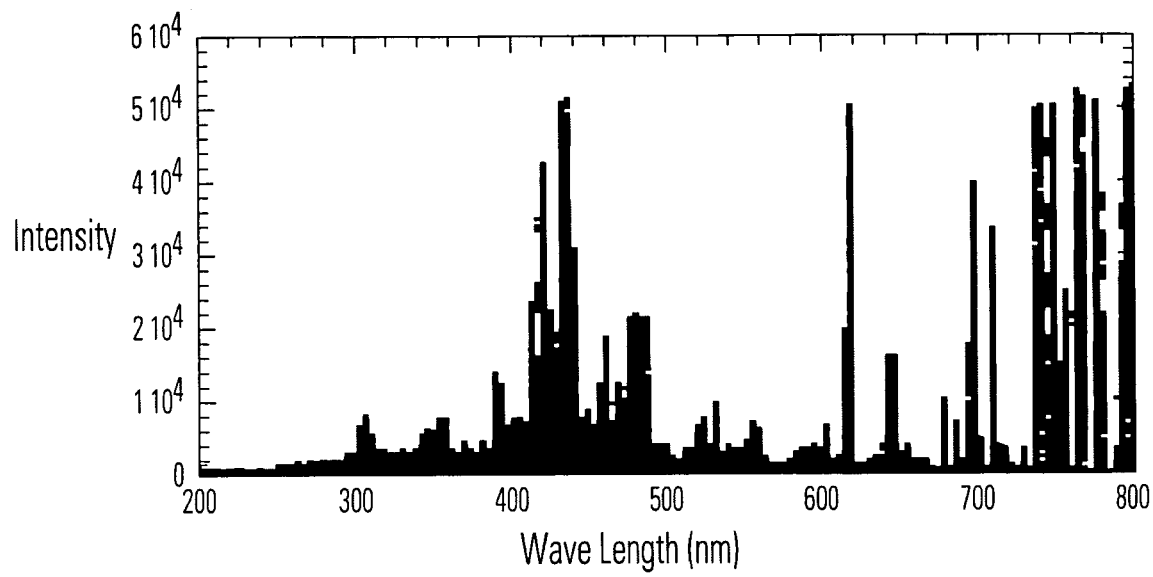
FIG. 1 is a graph showing the radiation spectrum generated during plasma processing in the wavelength region of 200 to 800 nanometers.

As already described above, plasma processes are often used when fabricating a semiconductor device. FIG. 1 is a graph from of IEEE Symposium on VLSI Technology Digest of Technical Papers 2002, "Avoiding Plasma Induced Damage to Gate Oxide With a Conductive Top Film (CTF) on PECVD Contact Etch Stop Layer", by Seung-Chul Song et al showing the electromagnetic radiation spectrum generated during typical plasma processing.

As can be seen from the graph, during plasma processing photons are generated with wavelengths ranging from about 200 to 800 nanometers (about 4.96 to 1.65 ev).

The Beer-Lambert Law describes the absorption of electromagnetic radiation by a layer as follows:

$$I = I_0 * e^{-\alpha d}$$

where: $I_0$ represents the initial intensity of the electromagnetic radiation prior to transiting the layer; I represents the intensity of the electromagnetic radiation once having transited the layer, d represents the layer thickness; and a represents the absorption coefficient.

The ratio ($I/I_0$) indicates the percentage of electromagnetic radiation that successfully transits the layer.

The absorption coefficient can also be expressed as follows:

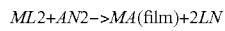

$$\alpha = (4\pi K)/\lambda$$

where K represents the extinction coefficient and λ represents the wavelength. The extinction coefficient K is a dimensionless quantity.

A Si/SiO$_2$ barrier within a typical semiconductor structure (such as at the interface with a gate oxide) has a band gap of around 4.3 eV. Incident photons having energies greater than about 4.3 eV (i.e. having wavelengths less than around 290 nm) may cause electrons to be excited to overcome the Si/SiO$_2$ barrier and injected into the SiO$_2$. The injection of such electrons degrades device behavior and gate oxide reliability.

Figure 2:
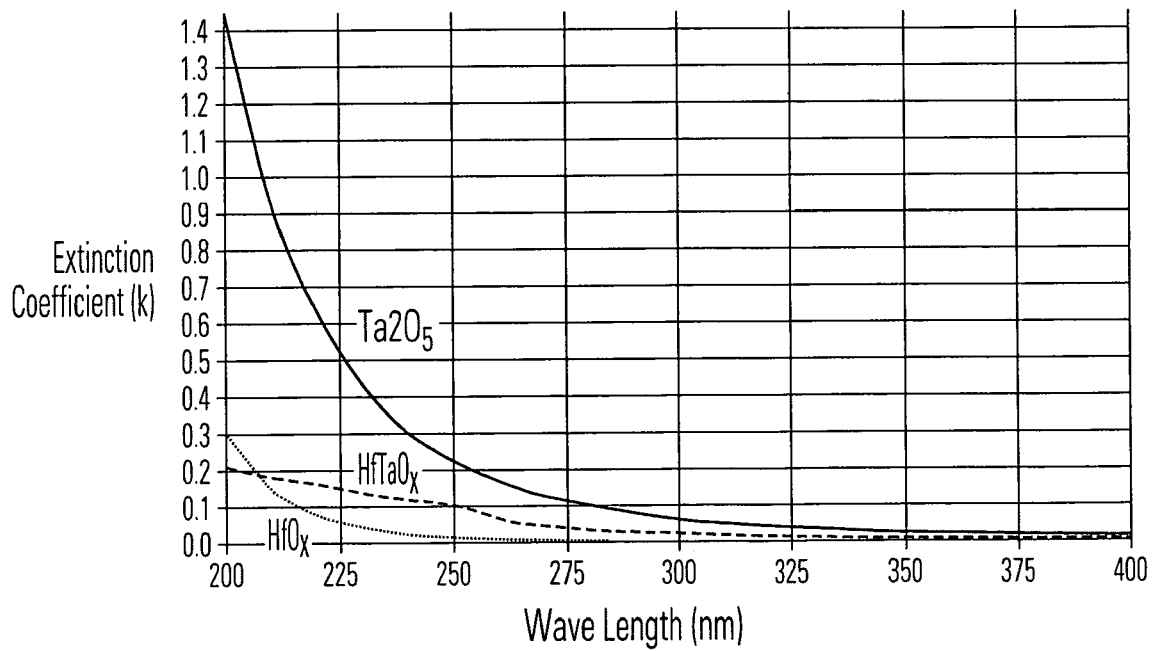
FIG. 2 is a graph showing the extinction coefficient against wavelength of an ultraviolet blocking layer according to embodiments.

FIG. 2 is a flowchart showing the method of manufacturing a typical semiconductor structure according to an embodiment which uses an ultraviolet blocking layer to prevent damage during plasma processing.

At step S10, following fabrication of an initial semiconductor structure such as, for example, a MOS or CMOS device, silicide contacts are formed using a self-aligned silicide process to provide ohmic contacts to the source, drain, and poly-Si gate regions. It will be appreciated that the initial semiconductor structure need not be a device but may also be an isolation structure or simply just a substrate.

At step S20, a contact etch stop layer is formed.

At step S30, an ultraviolet block layer is formed by atomic layer deposition under high vacuum conditions. The ultraviolet blocking layer is arranged to have a thickness of typically 5 to 200 Angstroms. The substrate (in this example the etch stop layer) is exposed to a first molecular precursor. The first molecular precursor is retained on the surface by chemisorption. A second molecular precursor is introduced, which reacts with the first molecular precursor. An exchange reaction takes place between the first and the second precursors and by-products are formed. The exchange reaction is self-limiting. The reaction can be described as follows:

$$ML2 + AN2 \rightarrow MA(\text{film}) + 2LN$$

where ML2 is the first precursor, AN2 is the second precursor, MA(film) is the ultraviolet blocking layer and LN is a by-product.

The process can be repeated in order to grow thicker films. Techniques for growing atomic layer deposition films are described in more detail in U.S. Patent Application Publication U.S. 2003/0168001 A1, assigned to Sundrew Technologies.

Figure 3:
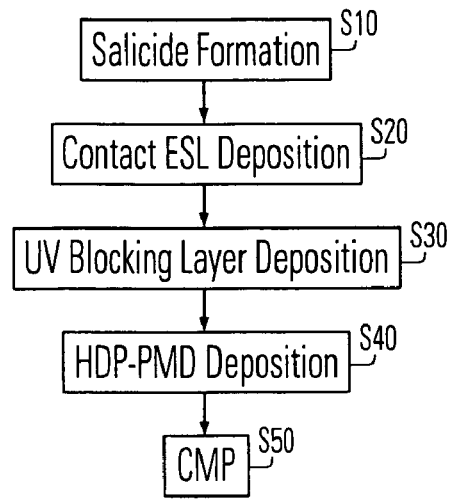
FIG. 3 is a flowchart showing the method of manufacturing a semiconductor structure according to embodiments.

Ta2O5, HfO2, and HfTaO2 are all suitable materials for use as the ultraviolet blocking layer. FIG. 3 is a graph from "UV-Shifted Durable Silver Coating for Astronomical Mirrors", Astronomical Telescopes and Instrumentation, Munich, 1 Jun. 2000, N Thomas and J Wolfe showing the extinction coefficient against wavelength of Ta2O5, HfO2, and HfTaO2.

As can be seen, the extinction coefficient of Ta2O5, HfO2, and HfTaO2 is greater than zero and less than about 1.5 for a range of wavelengths less than about 400 nanometers. In particular, the extinction coefficient of Ta2O5 is greater than about 0.08 and the extinction coefficient of HfTaO2 is greater than about 0.03 for wavelengths less than about 300 nm. Hence, Ta2O5 would be a preferred compound for use as a ultraviolet blocking material. Ta2O5, HfO2, and HfTaO2 also have dielectric constants of greater than about 25.

Accordingly, a Ta2O5 layer is grown by atomic layer deposition using TaI5 and O2 as the precursor (the first precursor) and oxidant (the second precursor) respectively, at a wafer temperature of about 25 to 200 Celsius. By using atomic layer deposition, the processing temperature can be maintained relatively low thereby protecting any device structures already formed.

A HfO2 layer can be grown by atomic layer deposition using HfCl4 and H2O as the precursor (the first precursor) and oxidant (the second precursor) respectively, at a wafer temperature of about 25 to 200 Celsius.

Returning to FIG. 2, at step S40, a pre-metal dielectric is deposited using a high density plasma technique. During the high density plasma technique, photons are generated which may damage the underlying semiconductor structure. However, the presence of the ultraviolet blocking layer reduces the damage caused by helping to prevent the transmission of these photons into the underlying semiconductor structure. The ultraviolet blocking layer has been selected such that it has an extinction coefficient in the energy range of the photons which would cause damaging electron-hole pairs to be generated thereby damaging device behavior or degrading gate oxide reliability.

At step S50, chemical mechanical polishing is carried out to enable surface planarization and to define metal interconnect patterns.

Whilst the above process has been described in the context of fabricating a particular device structure, it will be appreciated that this technique can readily be adapted when fabricating a range of semiconductor structures utilizing the ultraviolet blocking layer on initial semiconductor substrates as will be described in more detail with reference to FIGS. 4 to 7 below.

Figure 4:
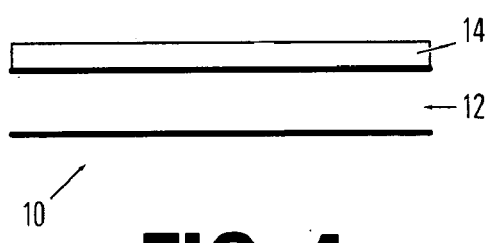
FIG. 4 illustrates an ultraviolet blocking layer overlying a semiconductor substrate according to one embodiment.

FIG. 4 shows a cross-sectional view of a portion of a semiconductor device 10. Semiconductor device 10 includes a semiconductor substrate 12. An ultraviolet blocking layer 14 is formed by atomic layer deposition overlying the semiconductor substrate 12.

The ultraviolet blocking layer 14 may be composed of one or more layers including Ta2O5, HfO2, and HfTaO2. In other embodiments, a layer or several layers may overlie the semiconductor substrate 12, beneath the ultraviolet blocking layer 14.

Figure 5:
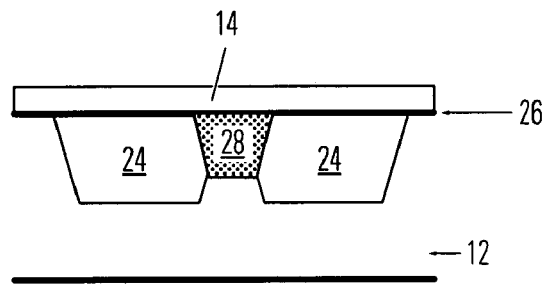
FIG. 5 illustrates a semiconductor device with an isolation structure covered by an ultraviolet blocking layer according to one embodiment.

FIG. 5 shows a semiconductor device 20 with an isolation structure 28 covered by an ultraviolet blocking layer 14. Semiconductor device 20 includes a semiconductor substrate 12, two doped regions 24 in the substrate 12 (below a top surface 26 of the substrate 22) and an isolation structure 28 between the two doped regions 24 and formed in part of each of the two doped regions 24. The two doped regions 24 are formed in the substrate 12 by implantation or diffusion. The doped regions 24 can be either n-type or p-type doped region. The isolation structure 28 comprises one of a shallow trench isolation (STI) and a localized oxidation isolation (LOCOS).

The ultraviolet blocking layer 14 is formed overlying the substrate 22, covering the two doped regions 24 and the isolation structure 28. The ultraviolet blocking layer 14 is formed by atomic layer deposition under high vacuum conditions. For example, a Ta2O5 layer is grown by atomic layer deposition using TaI5 and O2 as the precursor (the first precursor) and oxidant (the second precursor) respectively, at a wafer temperature of about 25 to 200 Celsius. Similarly, a HfO2 layer may be grown by atomic layer deposition using HfCl4 and H2O as the precursor and oxidant respectively, at a wafer temperature of about 25 to 200 Celsius. The extinction coefficient of the ultraviolet blocking layer 14 is greater than zero and less than about 1.4 for a range of wavelengths less than about 400 nanometers. The ultraviolet blocking layer 14 blocks vacuum ultraviolet radiation produced in any subsequent plasma process which would otherwise cause positive charges to be formed in the oxide of the isolation structure 28, thereby degrading its isolation properties. The low temperature used in the ultraviolet blocking layer formation helps to minimize degradation to the source/drain series resistance of the semiconductor device 20. The ultraviolet blocking layer 14 may be composed of one or more layers including Ta2O5, HfO2, and HfTaO2. In other embodiments, a layer or several layers may overlie the semiconductor substrate 12, beneath the ultraviolet blocking layer 14.

Figure 6:
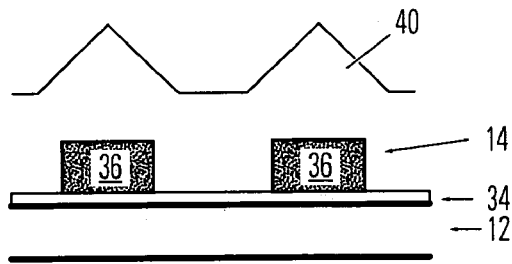
FIG. 6 illustrates a semiconductor device with a gate structure covered by an ultraviolet blocking layer according to one embodiment.

Referring to FIG. 6, another semiconductor device 30 is illustrated. Semiconductor device 30 includes a tunnel oxide 34 overlying the semiconductor substrate 12. A gate structure 36 overlies the tunnel oxide 34. An ultraviolet blocking layer 14 overlies the gate structure 36 and the tunnel oxide 34. An insulating layer 40 overlies the ultraviolet blocking layer 14. The tunnel oxide 34 is formed overlying the semiconductor substrate 12. The gate structure 36 is formed overlying the tunnel oxide 34. The ultraviolet blocking layer 14 is formed by atomic layer deposition overlying the substrate 12, covering the gate structure 36 and tunnel oxide 34.

The gate structure 36 comprises one of polysilicon, polysilicon/silicide composite and tungsten.

The ultraviolet blocking layer 14 is composed of a high dielectric constant dielectric comprising one or more layers including Ta2O5, HfO2, and HfTaO2. The dielectric constant of ultraviolet blocking layer 14 is greater than about 25. The ultraviolet blocking layer 14 is formed by atomic layer deposition under high vacuum conditions. For example, a Ta2O5 layer is grown by atomic layer deposition using TaI5 and O2 as the precursor (the first precursor) and oxidant (the second precursor) respectively, at a wafer temperature of about 25 to 200 Celsius. Similarly, a HfO2 layer may be grown by atomic layer deposition using HfCl4 and H2O as the precursor and oxidant respectively, at a wafer temperature of about 25 to 200 Celsius. The extinction coefficient of ultraviolet blocking layer 14 is greater than zero and less than about 1.4 for a range of wavelengths less than 400 nanometers.

The insulating layer 40, formed by plasma assisted process, overlies the ultraviolet blocking layer 38. The ultraviolet blocking layer 14 blocks vacuum ultraviolet radiation generated during the plasma process, such as during the insulating layer 40 formation, and prevents positive charge formation in the tunnel oxide 34 which would otherwise degrade device behavior.

In one embodiment, there further comprises a charge storage layer (not shown), for example a nitride layer, and a top oxide layer (not shown) overlying the tunnel oxide layer 34 and beneath the gate structure 36. In another embodiment, an insulating layer (not shown) is overlying the tunnel oxide layer 34 and the gate structure 36 and beneath the ultraviolet blocking layer 14.

Figure 7:
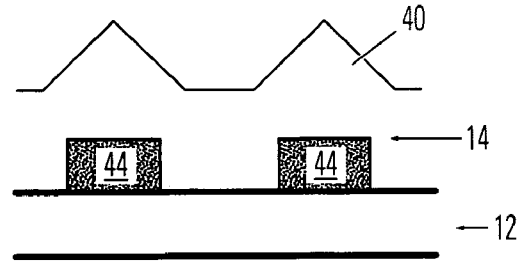
FIG. 7 illustrates a semiconductor device with a plurality of metal lines covered by an ultraviolet blocking layer according to one embodiment.

FIG. 7 illustrates a semiconductor device 40 with a plurality of metal lines 44 covered by an ultraviolet blocking layer 14. Device 40 includes a semiconductor substrate 12, a plurality of metal lines 44 on the substrate 12 and an ultraviolet blocking layer 14 overlying the metal lines 44. An insulating layer 40 is provided overlying the ultraviolet blocking layer 14.

The metal lines 44 include aluminum, aluminum alloys, copper and copper alloys. Layers of insulator and conductor (not shown) may be formed overlying the semiconductor substrate 12 and beneath metal lines 44. The ultraviolet blocking layer 14 maybe composed of a high dielectric material comprising one or more layers including Ta2O5, HfO2, and HfTaO2. The dielectric constant of ultraviolet blocking layer 14 is greater than about 25.

The ultraviolet blocking layer 14 is formed by atomic layer deposition overlying the substrate 12 and covering the metal lines 44. The ultraviolet blocking layer 14 is formed by atomic layer deposition under high vacuum conditions. For example, a HfO2 layer is grown by the atomic layer deposition using HfCl4 and H2O as the precursor and oxidant respectively, at a wafer temperature of about 25 to 200 Celsius. The extinction coefficient of the ultraviolet blocking layer 14 is greater than zero and less than about 1.4 for a range of wavelengths less than about 400 nanometers.

The insulating layer 40 is a dielectric, formed by a plasma assisted process and overlies the ultraviolet blocking layer 14. The ultraviolet blocking layer 14 blocks vacuum ultraviolet radiation generated during the plasma process, such as during the insulating layer 40 formation, and prevents positive charge formation which would otherwise degrade device behavior.

Hence, it will be appreciated that a technique is provided whereby a variety of semiconductor structures or devices are fabricated having an ultraviolet blocking layer. The ultraviolet blocking layer can be easily fabricated using a variety of materials at low temperatures. The provision of the ultraviolet blocking layer helps to reduce damage caused during subsequent plasma processing. This is because the photons produced during plasma processing at wavelengths which will cause damage are absorbed by the ultraviolet blocking layer. Accordingly, by utilizing an ultraviolet blocking layer, the quality and integrity of, for example, any pre-fabricated or existing gate oxide can be maintained even following plasma processing. Also, because the ultraviolet blocking layer can be produced at low temperatures, the integrity of any existing initial semiconductor structures are not compromised when the ultraviolet blocking layer is formed. Furthermore, because the ultraviolet blocking layer can be easily and readily formed, it can be used in a variety of situations and is not restricted to use in any particular semiconductor structure, for example, it can be used to protect not only gate oxides but also isolation and other structures.

Although particular embodiments of the invention have been described herein, it will be apparent that the invention is not limited thereto, and that many modifications and additions may be made within the scope of the invention. For example, various combinations of features of the following dependent claims could be made with the features of the independent claims without departing from the scope of the present invention.

We claim:

1. A method of fabricating a semiconductor structure, said method comprising the steps of:
    forming a tunnel oxide layer overlying a semiconductor substrate, forming a gate structure overlying the tunnel oxide layer, and forming a charge storage layer overlying said tunnel oxide layer beneath said gate structure to provide an initial semiconductor structure;
    forming a non-silicon layer overlying said initial semiconductor structure, said non-silicon layer having an extinction coefficient greater than zero at wavelengths below about 300 nanometers; and
    performing a plasma-based process to form a layer overlying said non-silicon layer, said non-silicon layer preventing said ultraviolet radiation generated during said plasma-based process from damaging said initial semiconductor structure.

2. The method of claim 1, wherein said non-silicon layer has a dielectric constant greater than about 20.

3. The method of claim 1, wherein said non-silicon layer comprises at least one of Ta2O5, $Ta_2O_5$, $HfO_2$ and $HfTaO_2$.

4. The method of claim 1, wherein said semiconductor structure is formed within an interlayer dielectric.

5. The method of claim 1, wherein said step of providing said initial semiconductor substrate further comprises the step of:
    forming at least an insulating layer overlying the tunnel oxide layer and the gate structure.

6. The method of claim 1, farther comprising the step of:
    forming an insulating layer overlying said non-silicon layer.

7. The method of claim 1, wherein said step of forming a charge storage layer further comprises the steps of:
    forming a nitride layer overlying said tunnel oxide layer; and
    forming a top oxide layer overlying said nitride layer, wherein said nitride layer and said top oxide layer are beneath said gate structure.

8. The method of claim 1, wherein said gate structure comprises at least one of polysilicon, polysilicon/silicide composite and tungsten.

9. The method of claim 1, wherein said non-silicon layer has an extinction coefficient greater than zero at wavelengths between about 200 and 300 nanometers.

10. The method of claim 9, wherein said non-silicon layer has an extinction coefficient of at least 0.03 at wavelengths below about 300 nanometers.

11. The method of claim 9, wherein said non-silicon layer has an extinction coefficient of at least 0.08 at wavelengths below about 300 nanometers.

12. The method of claim 1, wherein said non-silicon layer is formed by atomic layer deposition.

13. The method of claim 12, wherein said non-silicon layer is formed at a temperature of less than about 200 Celsius.

14. The method of claim 1, including:
    providing a surface on a semiconductor substrate;
    forming a doped region in said semiconductor substrate and below said surface; and
    forming an isolation structure in at least part of said doped region.

15. The method of claim 14, wherein said isolation structure comprises shallow trench isolation trench (STI) and localized oxidation isolation (LOCOS).

16. The method of claim 14, wherein said doped region comprises one of an n-type region and a p-type region.

17. The method of claim 1, including:
    providing a plurality of metal lines on the semiconductor substrate.

18. The method of claim 17, wherein said plurality of metal lines comprise at least one of aluminum, aluminum alloy and copper.

19. A semiconductor structure comprising:
    an initial semiconductor structure including a tunnel oxide layer overlying a semiconductor substrate, a gate structure overlying the tunnel oxide layer, and a charge storage layer overlying said tunnel oxide layer beneath said gate structure;

a non-silicon layer overlying said initial semiconductor structure, said non-silicon layer having an extinction coefficient greater than zero at wavelengths below about 300 nanometers; and a plasma process formed layer overlying said non-silicon layer.

20. The semiconductor structure of claim 19, wherein said non-silicon layer has an extinction coefficient greater than zero at wavelengths between about 200 and 300 nanometers.

21. The semiconductor structure of claim 19, wherein said non-silicon layer has an extinction coefficient of at least 0.03 at wavelengths below about 300 nanometers.

22. The semiconductor structure of claim 19, wherein said non-silicon layer has an extinction coefficient of at least 0.08 at wavelengths below about 300 nanometers.

23. The semiconductor structure of claim 19, wherein said non-silicon layer has a dielectric constant greater than about 20.

24. The semiconductor structure of claim 19, wherein said non-silicon layer comprises at least one of $Ta_2O_5$, $HfO_2$ and $HfTaO_2$.

25. The semiconductor structure of claim 19, wherein said semiconductor structure is formed within an interlayer dielectric.

26. The semiconductor structure of claim 19, including at least an insulating layer overlying the tunnel oxide layer and the gate structure.

27. The semiconductor structure of claim 19, further comprising an insulating layer overlying said non-silicon layer.

28. The semiconductor structure of claim 19, wherein said charge storage layer comprises:

a nitride layer overlying said tunnel oxide layer; and a top oxide layer overlying said nitride layer, wherein said nitride layer and said top oxide layer are beneath said gate structure.

29. The semiconductor structure of claim 19, wherein said gate structure comprises at least one of polysilicon, polysilicon/silicide composite and tungsten.

30. The semiconductor structure of claim 19, wherein said non-silicon layer is formed by atomic layer deposition.

31. The semiconductor structure of claim 30, wherein said non-silicon layer is formed at a temperature of less than about 200 Celsius.

32. The semiconductor structure of claim 19, including:

a surface on a semiconductor substrate;

a doped region in said semiconductor substrate and below said surface; and an isolation structure in at least part of said doped region.

33. The semiconductor structure of claim 32, wherein said isolation structure comprises shallow trench isolation trench (STI) and localized oxidation isolation (LOCOS).

34. The semiconductor structure of claim 32, wherein said doped region comprises one of an n-type region and a p-type region.

35. The semiconductor structure of claim 19, including a plurality of metal lines on the semiconductor substrate.

36. The semiconductor structure of claim 35, wherein said plurality of metal lines comprise at least one of aluminum, aluminum alloy and copper.

* * * * *